United States Patent [19]

Lofstrom

[11] Patent Number: 5,416,484
[45] Date of Patent: May 16, 1995

[54] DIFFERENTIAL COMPARATOR AND ANALOG-TO-DIGITAL CONVERTER COMPARATOR BANK USING THE SAME

[75] Inventor: Keith H. Lofstrom, Beaverton, Oreg.

[73] Assignee: Tektronix, Inc., Wilsonville, Oreg.

[21] Appl. No.: 46,313

[22] Filed: Apr. 15, 1993

[51] Int. Cl.$^6$ .............................. H03M 1/36
[52] U.S. Cl. .................... 341/159; 341/155; 327/77
[58] Field of Search ............ 341/155, 159; 307/350, 307/362

[56] References Cited

U.S. PATENT DOCUMENTS

| | | | |
|---|---|---|---|
| 4,907,121 | 3/1990 | Hrassky | 361/154 |
| 4,990,799 | 2/1991 | Weiss | 307/355 |
| 5,043,599 | 8/1991 | Zitta | 307/355 |
| 5,065,045 | 11/1991 | Mok | 307/355 |
| 5,072,220 | 12/1991 | Petschacher et al. | 341/156 |
| 5,138,318 | 8/1992 | Matsuzawa | 341/156 |
| 5,194,866 | 3/1993 | Imaizumi | 341/156 |
| 5,264,851 | 11/1993 | Yasuda | 341/158 |

Primary Examiner—Marc S. Hoff
Attorney, Agent, or Firm—Peter J. Meza; Boulden G. Griffith

[57] ABSTRACT

A fully differential comparator includes a differential signal input, a differential reference input, and a differential signal output. Identical first and second gain stages are used in the differential comparator that each have a first single-ended input, a second single-ended input, and a differential output. The first single-ended inputs from the first and second gain stages form the differential signal input of the differential comparator. The second single-ended inputs from the first and second gain stages form the differential reference input of the differential comparator. The differential outputs of the first and second gain stages are cross-coupled to form the differential signal output of the differential comparator. The differential comparator can be used in conjunction with a conventional resistor string found in the front end of a flash ADC, but in a novel manner that prevents undesirable loading effects, as well as other problems associated with prior art single-ended comparators.

11 Claims, 6 Drawing Sheets

DIFFERENTIAL COMPARATOR AND ANALOG-TO-DIGITAL CONVERTER COMPARATOR BANK USING THE SAME

BACKGROUND OF THE INVENTION

This invention relates generally to comparator circuits and more particularly to fully differential comparator circuits (differential input, reference, and output) and their application in analog-to-digital converters ("ADCs").

A conventional single-ended comparator 10 (single-ended input, reference, and output) is shown as a circuit symbol and in schematic form in FIG. 1. The triangular circuit symbol shows a positive input at node 1, a negative input at node 2, and an output at node 3. Either the positive input or the negative input can be used as the input or reference. Generally, the positive input serves as the single-ended nput, while the negative input is coupled to a source of reference voltage, resulting in a non-inverted output. The circuit symbol is labeled "comp". In schematic form, conventional comparator 10 is shown to include a pair of emitter-coupled NPN bipolar transistors QS and QR. The base of transistor QS is node 1, the positive input, which is labeled "SIG" and receives an analog signal input. The base of transistor QR is node 2, the negative input, which is labeled "REF" and receives a reference input voltage. Transistors QS and QR are biased via constant current source IEE, which is in turn coupled to a source of negative supply voltage VEE. The collector of transistor QS is coupled to a source of positive supply voltage VCC, while the collector of transistor QR is coupled to VCC through load resistor RL to form the comparator output voltage. The junction of the collector of transistor QR and load resistor RL is node 3, which is labeled "OUT" and provides the comparator voltage output signal. Note that SIG, REF, and OUT are all single-ended voltages. Note further that the input current at the base of transistors QS and QR are different (one is substantially zero, the other approximately equal to IEE/beta, wherein beta is transistor current gain), depending upon the logic state of the comparator.

A comparator bank and series resistor string for a "flash" ADC using eight conventional single-ended comparators is shown in FIG. 2. The comparator bank is coupled to the input signal SIG at node 16, which has a specified operating range of, for example, −4 to +4 volts. Comparator reference voltages are generated by the internal nodes of a serially-connected resistor string including resistors R1 through R9. The first resistor in the string, R1, is coupled to a lower reference voltage, REFN at node 14, which corresponds to the lower bound of the input signal, viz. −4 volts. Similarly, the last resistor in the string, R9, is coupled to an upper reference voltage, REFP at node 12, which corresponds to the upper bound of the input signal, viz. +4 volts. The internal nodes of the resistors string, nodes 20 through 27, generate a series of reference voltages that are uniformly spaced across the input signal range. The resistors have the relative values shown, i.e. resistors R2 through R8 have a relative value of unity, whereas the first and last resistors R1 and R9 have a relative value of one-half. The reference voltages on nodes 20 through 27 thus range from −3.5 volts at node 20 to +3.5 volts at node 27, and are equally spaced apart in one volt steps. The absolute value of the resistors are chosen according to power consumption, input bias current, and accuracy specifications.

Eight comparators, corresponding to the eight internal reference voltages are connected to the resistor string and to the input signal, and are labeled "C−3.5" through "C+3.5". The positive input of each of the comparators is coupled to the input signal node 16. The negative input of each of the comparators is coupled to the corresponding reference voltage. For example, the negative input of comparator C+0.5 is coupled to node 24, which has a reference voltage value of 0.5 volts. The outputs of the comparators provide thermometer scale data at output nodes D0 through D7. The digital data at node D0 is the least significant bit corresponding to an input signal greater than 3.5 volts for a logic one, and an input signal less than −3.5 volts for a logic zero. The digital data at node D7 is the most significant bit corresponding to an input signal more positive than 3.5 volts for a logic one, and an input signal less than 3.5 volts for a logic zero.

When the single-ended comparator 10 shown in FIG. 1 is used in the comparator bank of FIG. 2, inaccuracies can result. The loading of the resistor string with the input bias currents of the comparator can affect the precise linear distribution of the reference voltages over the input signal range, resulting in a parabolic response known as "droop." In addition to resistor string loading, the single-ended design of the comparator increases the susceptibility to common-mode signals, increases distortion, and has a nonlinear delay that is a function of input signal level.

What is desired is a fully differential comparator that, by design, eliminates the problems of a single-ended comparator and is therefore useful in the comparator bank of an ADC, as well as other applications.

SUMMARY OF THE INVENTION

It is, therefore, a principal object of the present invention to provide a fully differential comparator design for use in a comparator bank of a flash ADC, among other applications.

It is another object of the invention to correct certain circuit performance anomalies caused by single-ended comparators.

It is an advantage of the invention that the differential comparator can be easily fabricated on an integrated circuit.

It is another advantage of the invention that the same ADC resistor string used in conjunction with single-ended comparators can be used with the fully differential comparator of the present invention.

According to the present invention a fully differential comparator includes a differential signal input, a differential reference input, and a differential signal output. Identical first and second gain stages are used in the differential comparator. Each gain stage has a first single-ended input, a second single-ended input, and a differential current output. The first single-ended inputs from the first and second gain stages form the differential signal input of the differential comparator. The second single-ended inputs from the first and second gain stages form the differential reference input of the differential comparator. The differential current outputs of the first and second gain stages are cross-coupled to form the differential signal output of the differential comparator. The differential comparator can be used in conjunction with a conventional resistor string found in the front end of a flash ADC, but in a novel manner that prevents undesirable loading effects, as well as other problems associated with prior art single-ended comparators.

The foregoing and other objects, features and advantages of the invention will become more readily apparent from the following detailed description of a preferred embodiment of the invention which proceeds with reference to the accompanying drawings.

DETAILED DESCRIPTION

Figure 1:
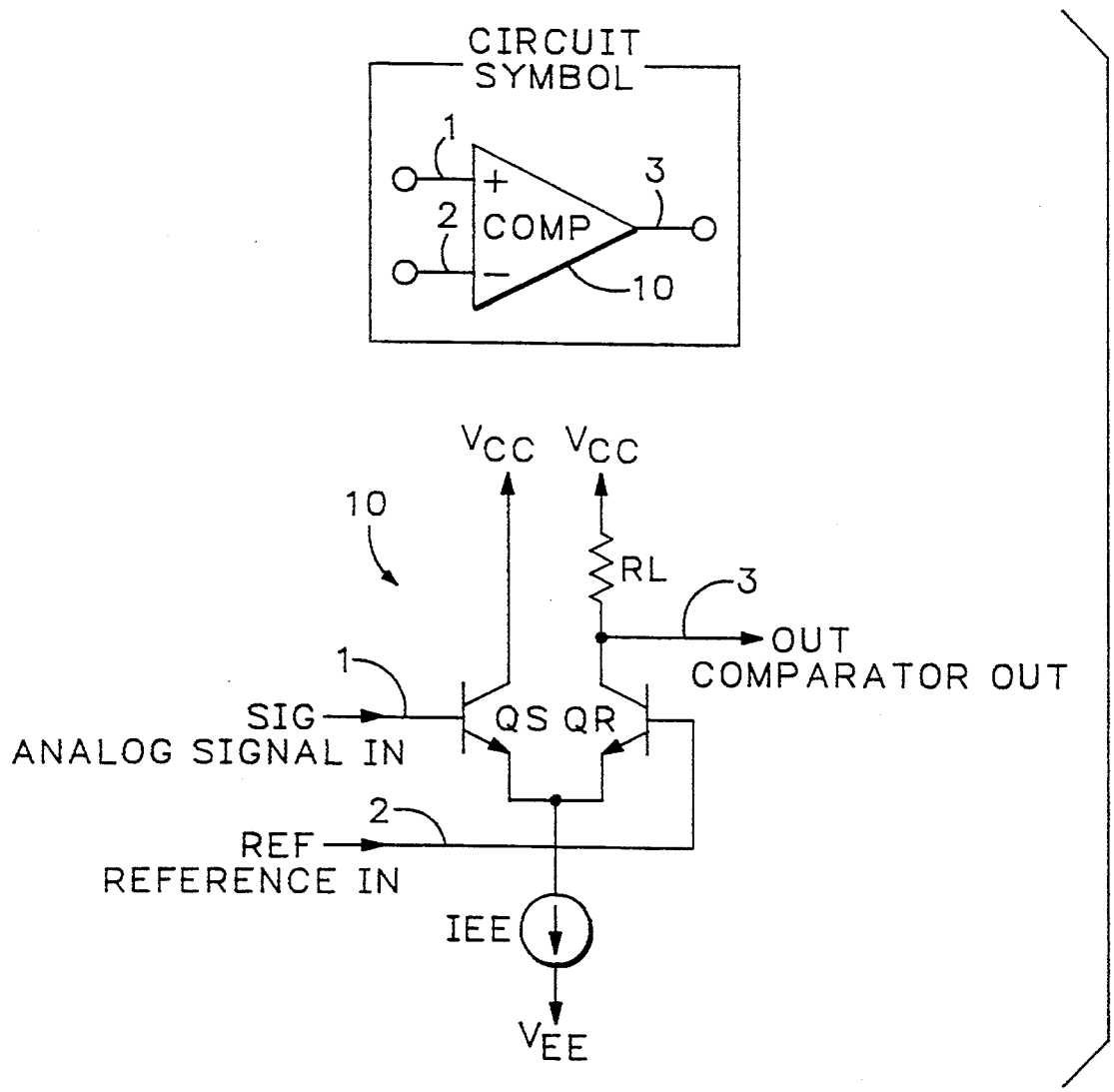
FIG. 1 is a schematic diagram and corresponding circuit symbol of a prior art single-ended comparator.
Figure 2:
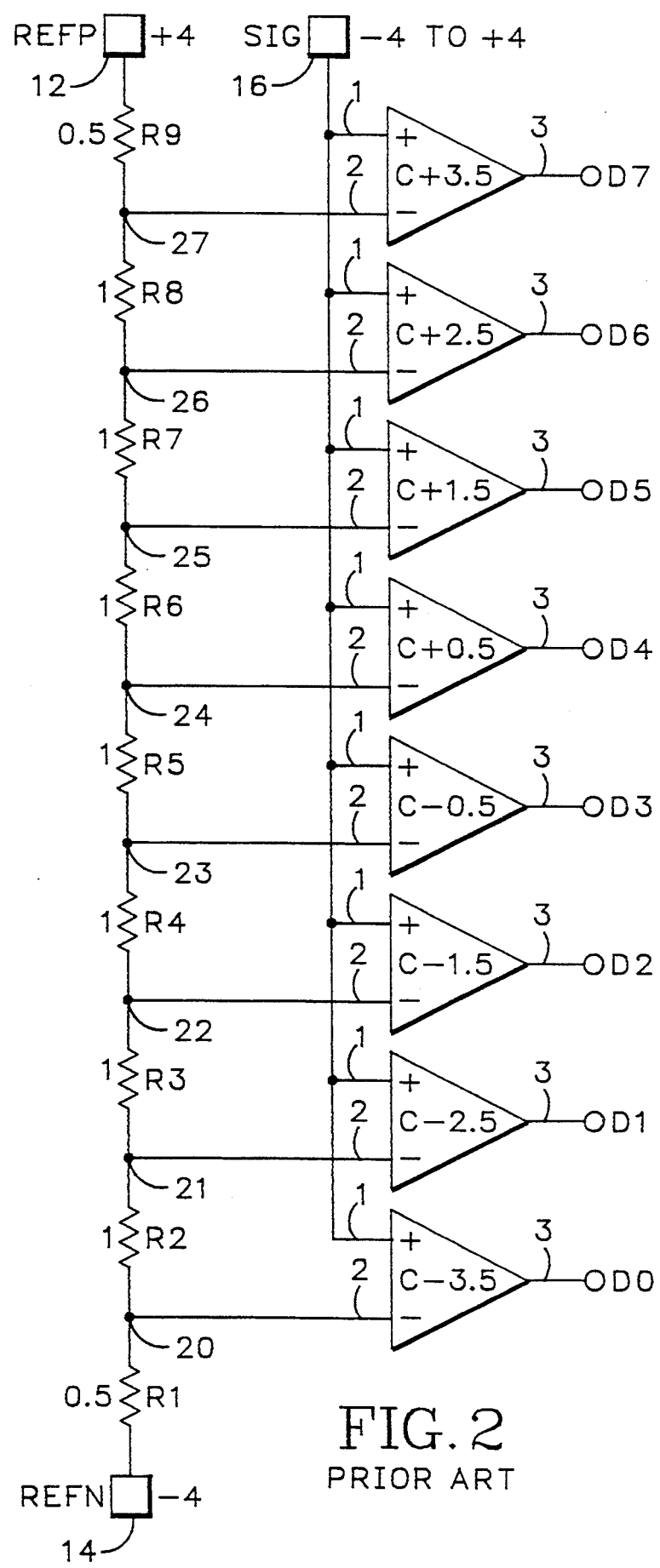
FIG. 2 is a resistor string and comparator bank for a flash ADC using the single-ended comparator of FIG. 1.
Figure 3:
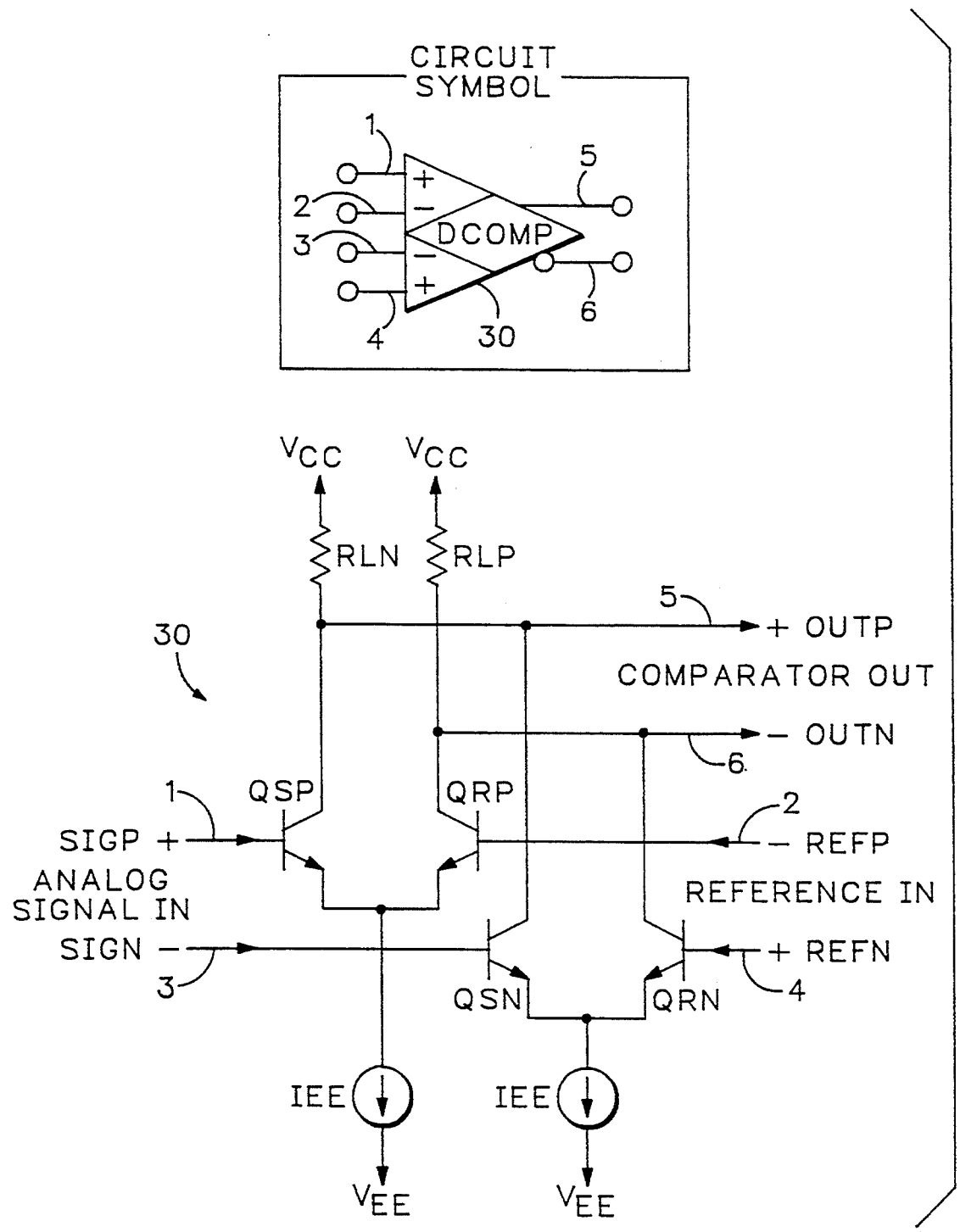
FIG. 3 is a schematic diagram and corresponding circuit symbol for a fully differential comparator of the present invention.

Referring now to FIG. 3, a circuit symbol, labeled "dcomp" is shown for a fully differential comparator 30, which includes a differential signal input (circuit nodes 1 and 3), a differential reference input (circuit nodes 2 and 4), and a differential signal output (circuit nodes 5 and 6). The circuit symbol combines the conventional symbol for two single-ended comparators to show the two positive inputs, the two negative inputs, and the non-inverted and inverted outputs.

A corresponding simplified schematic diagram of differential comparator 30 is also shown in FIG. 3. Comparator 30 includes a first gain stage including transistors QSP and QRP and a constant current source IEE. The first gain stage has a positive single-ended input (circuit node 1 labeled "SIGP"), a negative single-ended input (circuit node 2 labeled "REFP"), and a differential output (current supplied by the collectors of transistors QSP and QRP, converted into a differential voltage at circuit nodes 5 and 6 by load resistors RLN and RLP). A second gain stage includes transistors QSN and QRN and an identical constant current source IEE. The second gain stage has a positive single-ended input (circuit node 4 labeled "REFN"), a negative single-ended input (circuit node 3 labeled "SIGN"), and a differential output (current supplied by the collectors of transistors QSN and QRN, converted into a differential voltage at circuit nodes 5 and 6 by shared load resistors RLN and RLP.) The single-ended voltages at circuit nodes 5 and 6 that form the differential output voltage are labeled "OUTP" and "OUTN", respectively.

The "left" single-ended inputs from the first and second gain stages (circuit nodes 1 and 3) are combined to form the differential signal input labeled "Analog Signal In". The "right" single-ended inputs from the first and second gain stages (circuit nodes 2 and 4) are combined to form the differential reference input labeled "Reference In". The differential current outputs of the first and second gain stages are cross-coupled to form a differential current output. "Cross-coupling" refers to the coupling of the collector of transistor QSP to the collector of transistor QRN, and the coupling of the collector of transistor QRP to the collector of transistor QSN, as shown in FIG. 3. The differential current output is converted into a differential voltage output at circuit nodes 5 and 6 and is labeled "Comparator Out".

Each of the first and second gain stages in FIG. 3 is shown to be a differential pair of emitter-coupled NPN bipolar transistors biased by a identical value current source IEE. Other types of transistors, such as PNP bipolar transistors, or even MOS devices can be used, however, depending upon the desired application. It is desirable that each of the transistors in the first and second gain stages be "matched", i.e. substantially identical in size and arranged on an integrated circuit to minimize thermal gradients.

The operation of fully differential comparator 30 can best understood first by assuming that there is no common mode voltage difference between the signal or reference inputs. Expressed as an equation:

$$V(SIGP) + V(SIGN) = V(REFP) + V(REFN). \quad [1]$$

If the positive and negative single-ended inputs of the gain stages are also equal, the output currents of all four collectors are equal, and the differential voltage output (and differential output current) is equal to zero volts. The zero volt condition is expressed in the following two equations:

$$V(SIGP) = V(REFP); \text{ and} \quad [2]$$

$$V(SIGN) = V(REFN). \quad [3]$$

As the two components of the differential input signal move differentially away from the two components of the differential reference input, the two gain stages provide equal output currents, which are cross-coupled and add together to produce the total output current. In the case of no common mode voltage, the fully differential comparator 30 operates in much the same manner as single-ended comparator 10. However, smaller input signal swings can be used for the same noise margin.

Assuming now that a common mode voltage VCM exists, the performance of comparator 30 can be further analyzed to show the rejection of that common mode voltage. Assume that the common mode voltage is applied to each side of the differential input voltage such that:

$$V(SIGP) = V(REFP) + VCM; \text{ and} \quad [4]$$

$$V(SIGN) = V(REFN) + VCM.$$

Each gain stage in differential comparator 30 now has the same voltage across its own differential input (nodes 1, 2 and nodes 3, 4) and the same, but now unbalanced, output current is produced by each of the gain stages. However, the output currents are cross-coupled such that the net output signal, once the currents are combined and converted to a differential voltage, is zero. (The differential output current, of course, is also zero.) Therefore, common mode differences between the differential input and differential reference are rejected. As the common mode voltage VCM is increased, the differential gain of both of the gain stages in comparator 30 decreases, and the net differential gain also decreases. Ultimately, both gain stages limit, and the differential gain from differential input to differential output is zero. This operating point defines the upper limit of the common mode rejection. The maximum common mode specification thus dictates the maximum acceptable input signal range for comparator 30.

Because of the symmetry of differential comparator 30, delay through the comparator as a function of the input signal is reduced. In single-ended comparator 10 operating with large, high frequency input signals, the delay through the comparator changes as a function of input signal shape, amplitude and frequency. The result is harmonic distortion and, in the ADC application, loss of effective bits. A large part of this delay variation is due to nonlinear common-mode currents through the base-emitter and base-collector parasitic capacitances of the bipolar transistors in the comparator. Differential comparator 30 considerably reduces high speed delay distortion. Because of the symmetrical design there is a first order cancellation of capacitor currents, including even harmonics of those currents. Odd harmonics, while not cancelled in the same manner, are reduced since the signal swing from each gain stage can also be reduced by half for the same noise margin.

Figure 4:
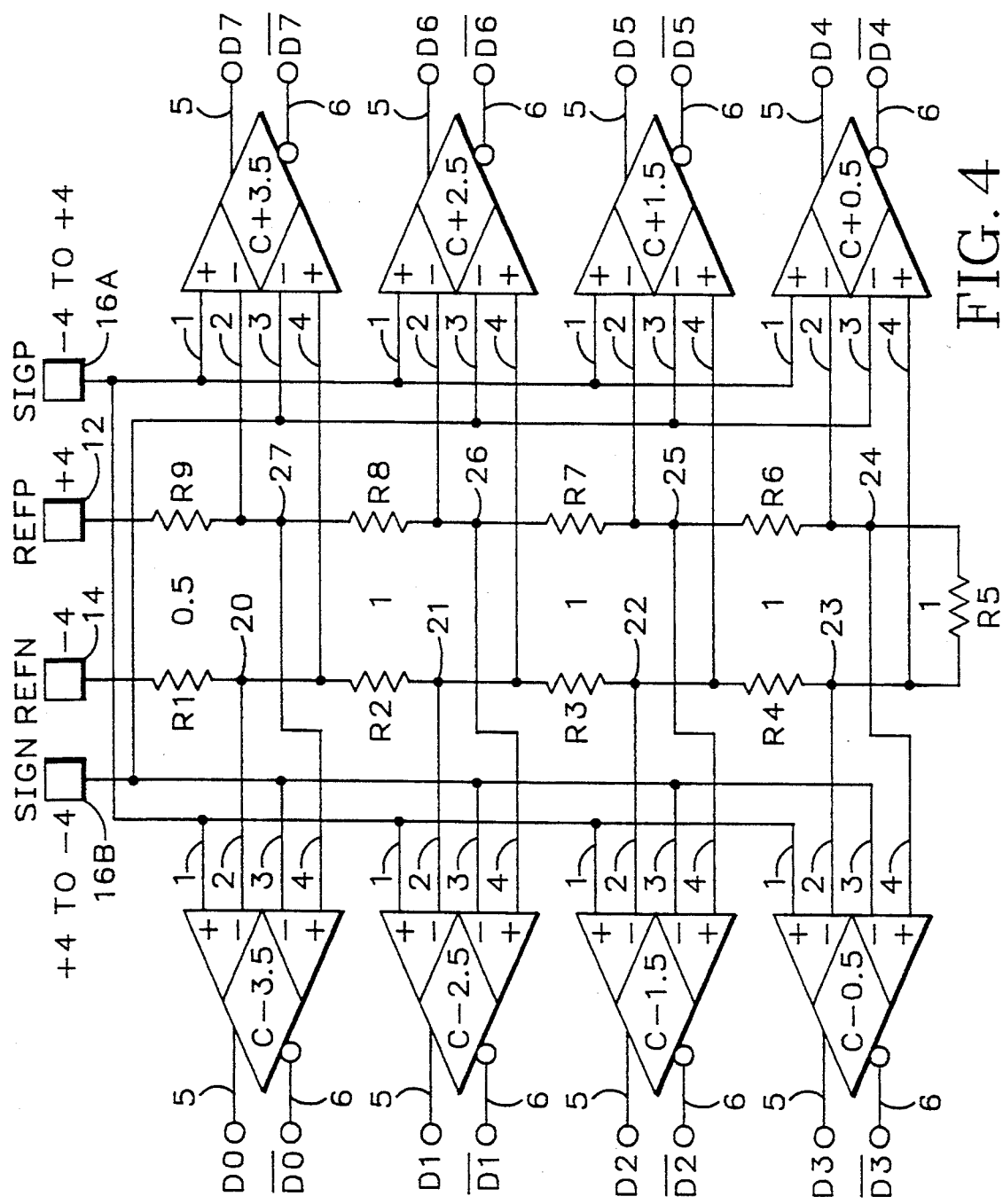
FIG. 4 is a resistor string and comparator bank for a flash ADC using the fully differential comparator of FIG. 3.

A differential comparator bank (comparators C−3.5 through C+3.5) and series-connected resistor string (resistors R1 through R9) are shown in FIG. 4 for use in a flash ADC. Note that the input, the reference, and the output of the comparator bank are all differential. The positive signal input component is applied at circuit node 16A and designated SIGP, the negative signal input is applied at circuit node 16B and is designated SIGN, and the positive and negative reference inputs are applied at circuit nodes 12 and 14, designated REFN and REFP. The comparator bank includes eight differential comparators, although any other number can be used, depending upon the precision required in the ADC. The differential signal inputs (nodes 1 and 3) of each of the differential comparators are coupled across the positive and negative signal inputs SIGP and SIGN, and the differential signal outputs of the differential comparators provide a digitized differential output (D0 and/D0 through D7 and/D7) corresponding to the level of a differential analog signal on the positive and negative signal inputs. The differential outputs are provided in thermometer code. The number of serially connected resistors (R1 through R9) is one greater than the number of differential comparators. The first resistor R1 is coupled to the negative reference input REFN, and the last resistor R9 is coupled to the positive reference input REFP. The serially connected resistors have a number of internal nodes that is one less than the number of differential comparators. The internal nodes are coupled in a predetermined pattern to the differential reference inputs of the differential comparators. The differential reference input of the first differential comparator C−3.5 is coupled across first and last internal nodes 20 and 27 and the differential reference input of the second differential comparator C−2.5 is coupled across the second and next-to-last internal nodes 21 and 26. This configuration repeats until the differential reference input of the last differential comparator C+3.5 is coupled across the last and first internal nodes 27 and 20. Note that the reference inputs for the first and last differential comparators in the comparator bank are coupled to the same nodes, but that the polarity is reversed.

Note that only one resistor string, not two, is needed for the differential configuration shown in FIG. 4. Also, the number of resistors and internal node taps for the internal reference voltages is the same, although there are twice as many comparator inputs. This is because one internal reference voltage is used by two comparator inputs. For example, node 22 is the negative reference input for comparator C−1.5, but is also the positive reference input for comparator C+1.5.

Due to the differential configuration of the comparator bank, resistor string loading is constant at DC, independent of input signal. Any droop caused by the loading is effectively cancelled by the differential comparators. Each differential comparator taps the ladder symmetrically with its positive and negative reference inputs. Thus, droop can be considered a common mode voltage at the reference inputs, and is substantially rejected.

Figure 5:
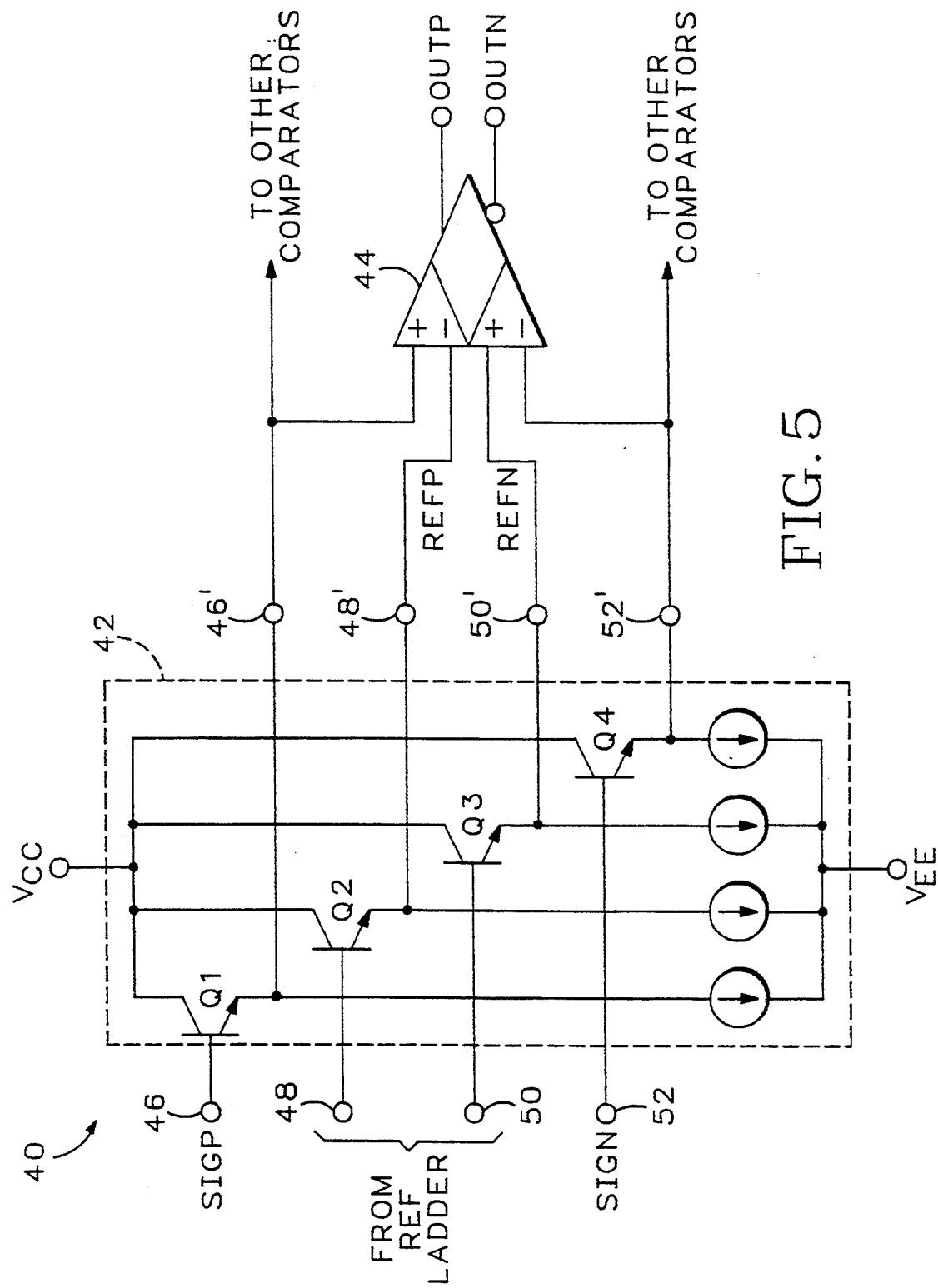
FIG. 5 is a schematic diagram showing an input buffer stage coupled to the inputs of the differential comparator.

An AC signal applied to the comparator inputs creates capacitive currents into the resistor taps and positive and negative signal nodes. Because of the symmetry created by the differential circuitry, these currents cancel to the first order. Further improvement can be made by buffering the input signal and the resistor ladder taps Referring now to FIG. 5, circuit 40 includes an input buffer section 42 and a differential comparator 44. The buffer section includes transistors Q1 through Q4, biased with constant current sources in an emitter-follower configuration. Although single NPN bipolar transistors are used in the buffer section, other types of active devices can be used such as MOS transistors, or multi-transistor buffer circuits. The inputs at nodes 46 through 52 are buffered and coupled to the input of differential comparator 44 at corresponding input nodes 46' through 52'. The input buffer section 42 does not eliminate input bias current. Depending upon the current gain of the transistors used, and the amount of bias current, the input bias current can be about the same as the input bias current of differential comparator 44. What input buffer section 42 does eliminate is the sensitivity of the input bias current to the switching action of the comparator. Regardless of the logic state of comparator 44, the input bias currents at nodes 46 through 52 are substantially constant. Thus, the current loading on the resistor string is also substantially constant, creating a true common mode error voltage that is cancelled as described above.

Figure 6:
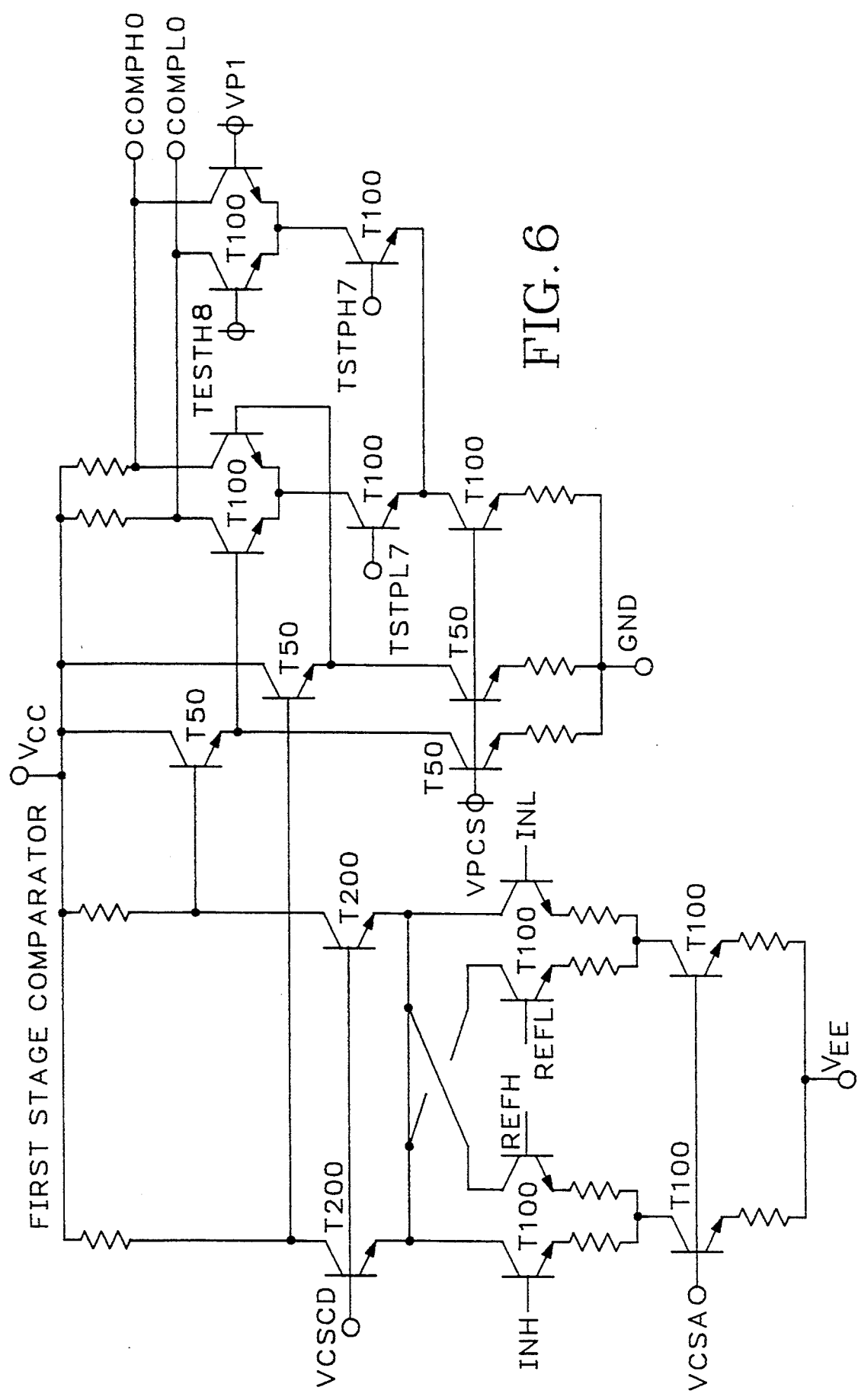
FIG. 6 is a more complete schematic diagram of the fully differential comparator of the present invention.

In FIG. 6 a complete schematic of a differential comparator is shown. The schematic is essentially equivalent to the schematic shown in FIG. 3, with the addition of a cascode stage and an additional gain stage. Also, the gain stages in the differential comparator and the cascode stage include degeneration resistors for controlling gain and high frequency performance. An additional gain and output latch stage is also included. The comparator shown in FIG. 6 is easily modified to include the input buffer stage shown in FIG. 5.

Having described and illustrated the principles of the invention in a preferred embodiment thereof, it is appreciated by those having skill in the art that the invention can be modified in arrangement and detail without departing from such principles. For example, although the schematic diagrams show a bipolar transistor-based circuit, it is known by those skilled in the art that an equivalent FET-based circuit can be built. Further, the applications for the fully differential comparator of the present invention are not limited to ADCs, but can be used wherever common-mode rejection is required, or in any application in which the symmetry of the design yields a performance advantage. We therefore claim all modifications and variation coming within the spirit and scope of the following claims.

I claim:

1. A differential comparator comprising:
   a differential signal input;
   a differential reference input;
   a differential signal output;
   a first gain stage having a first single-ended input, a second single-ended input, and a differential output; and
   a second gain stage having a first single-ended input, a second single-ended input, and a differential output,
   the first single-ended inputs from the first and second gain stages forming the differential signal input, the second single-ended inputs from the first and second gain stages forming the differential reference input, and the differential outputs of the first and second gain stages being cross-coupled to form the differential signal output.

2. A differential comparator as in claim 1 in which each of the first and second gain stages comprises a differential pair of emitter-coupled transistors biased by a current source.

3. A differential comparator as in claim 2 in which each of the transistors in the first and second gain stages is substantially identical in size.

4. A differential comparator as in claim 2 in which each of the transistors comprises an NPN bipolar transistor.

5. A differential comparator as in claim 2 in which each of the current sources is substantially identical in value.

6. A comparator bank for use in an analog-to-digital converter comprising:
   a positive signal input;
   a negative signal input;
   a positive reference input;
   a negative reference input;
   N differential comparators according to claim 1, wherein N is a positive integer, the differential signal inputs of the differential comparators being coupled across the positive and negative signal inputs, the differential signal outputs of the differential comparators providing a digitized output corresponding to an analog signal on the positive and negative signal inputs;
   N+1 serially connected resistors, a first resistor being coupled to the positive reference input, and a last resistor being coupled to the negative reference input,
   the serially connected resistors having N−1 internal nodes coupled in a predetermined pattern to the differential reference inputs of the differential comparators.

7. A comparator bank as in claim 6 in which the predetermined pattern comprises:
   the differential reference input of a first differential comparator being coupled across first and (N−1)th internal nodes; and
   the differential reference input of a second differential comparator being coupled across second and (N−2)th internal nodes,
   wherein the differential reference input of subsequent differential comparators are coupled to the corresponding internal nodes until the differential reference input of an Nth differential comparator is coupled across the (N−1)th and first internal nodes.

8. A comparator bank as in claim 6 in which a second through Nth resistor have a resistance value of R ohms, and a first and (N+1)th resistor have a resistance value of (R/2) ohms.

9. A comparator bank as in claim 6 in which the negative reference input receives a voltage of −V volts, the positive reference input receives a voltage of +V volts, and the signal range on the positive and negative signal inputs is between −V and +V volts.

10. A comparator bank as in claim 6 in which at least one of the differential comparators further comprises an input buffer stage for maintaining substantially constant input bias currents.

11. A differential comparing method comprising the steps of:
    (a) comparing a first leg of a differential signal input to a first leg of a differential reference input;
    (b) generating a first differential output signal in response to comparing step (a);
    (c) comparing a second leg of a differential signal input to a second leg of a differential reference input;
    (d) generating a second differential output signal in response to comparing step (c); and
    (e) cross-coupling the first and second differential output signals to generate a third differential output signal.

* * * * *